United States Patent
Tak et al.

(10) Patent No.: US 8,503,239 B2
(45) Date of Patent: Aug. 6, 2013

(54) DEVICE FOR CONTROLLING LOCK STATE OF BLOCK IN A SEMICONDUCTOR MEMORY AND METHOD FOR CONTROLLING THE SAME

(75) Inventors: Jung Mi Tak, Pohang (KR); Ji Hyae Bae, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 288 days.

(21) Appl. No.: 12/980,267

(22) Filed: Dec. 28, 2010

(65) Prior Publication Data

US 2012/0137046 A1    May 31, 2012

(30) Foreign Application Priority Data

Nov. 29, 2010  (KR) ........................ 10-2010-0120049

(51) Int. Cl.
*G06F 12/00*    (2006.01)
*G06F 13/00*    (2006.01)

(52) U.S. Cl.
USPC ................. 365/185.11; 365/185.01; 713/500; 713/600; 711/163; 711/152; 711/103

(58) Field of Classification Search
USPC ............. 711/163, 152, 103; 365/205, 185.11, 365/185.01; 713/500, 600
See application file for complete search history.

(56) References Cited

U.S. PATENT DOCUMENTS

2004/0049645 A1*  3/2004  Lee et al. ...................... 711/163
2008/0126728 A1*  5/2008  Fernald ......................... 711/163

FOREIGN PATENT DOCUMENTS

| KR | 1019940026691 A | 12/1994 |
| KR | 1020070107416 A | 11/2007 |
| KR | 100902398 B1 | 6/2009 |

* cited by examiner

*Primary Examiner* — Hong Kim

(57) ABSTRACT

A block control device for a semiconductor memory and a method for controlling the same are disclosed, which relate to a technology for controlling a block operation state of a Low Power Double-Data-Rate 2 (LPDDR2) non-volatile memory device. A block control device for use in a semiconductor memory includes a block address comparator configured to compare a first block address with a last block address, and output a same pulse or unequal pulse according to the comparison result, a block address driver configured to output a lock state control signal for driving a block address in response to the same pulse, a block address counter configured to count block addresses from the first block address to the last block address in response to the unequal pulse, and generate a block data activation pulse, and a block address register configured to store a lock state of a corresponding block in response to the lock state control signal and the block data activation pulse.

29 Claims, 7 Drawing Sheets

DEVICE FOR CONTROLLING LOCK STATE OF BLOCK IN A SEMICONDUCTOR MEMORY AND METHOD FOR CONTROLLING THE SAME

CROSS-REFERENCE TO RELATED APPLICATION

The priority of Korean patent application No. 10-2010-0120049 filed on Nov. 29, 2010, the disclosure of which is hereby incorporated in its entirety by reference, is claimed.

BACKGROUND OF THE INVENTION

Embodiments of the present invention relate to a block control device for a semiconductor memory and a method for controlling the same, and more specifically, to a technology for controlling a block operation state of a Low Power Double-Data-Rate 2 (LPDDR2) non-volatile memory device.

Presently, memory devices are largely classified into volatile DRAMs and non-volatile flash memories.

The DRAM adjusts a channel width of a lower gate in response to a voltage applied to the gate, forms a channel between a source terminal and a drain terminal, and enables a capacitor coupled to the source terminal to be charged with electrons or to be discharged. Thereafter, the DRAM reads the charging or discharging state, such that it can identify data of '0' or of '1'.

The DRAM is a volatile memory device, such that it has a disadvantage in that it has to continuously recharge capacitors with electricity. If the DRAM is powered off, data in the DRAM is unavoidably lost because of a leakage current, resulting in a large amount of power consumption.

Therefore, the demand of non-volatile memory devices, that are capable of maintaining stored information even when the non-volatile memory devices are powered off, is rapidly increasing.

F-N tunneling occurs in a NAND flash memory because of a voltage applied to a control gate and a channel region, such that a floating gate is charged with electrons or is discharged through the F-N tunneling. In accordance with the NAND flash memory, there arises a variation in threshold voltage of a channel region according to the charging or discharging state. The NAND flash memory reads such a variation in threshold voltage so that it can identify data of 0 or of 1 according to the read variation result.

In order to overcome the shortcomings of DRAM and flash memory and implement a next-generation memory device having advantages of the DRAM and the flash memory, many research institutes and companies are conducting intensive research into next-generation memory devices.

Research fields of the next-generation memory devices have been diversified according to constituent materials of a cell used as a basic unit inside of the next-generation memory device.

That is, a representative example of the next-generation memory is a phase change memory that makes data of 0 or of 1 using a resistance difference generated when a phase change material is cooled upon receiving a current. In this case, the difference in resistance is generated according to whether the cooled phase change material is in a solid state or an amorphous state having high resistance.

In addition, PoRAM is a memory device based on bistability conductive characteristics generated when a voltage is applied to a conductive organic material. In this case, the bistability conductive characteristics indicate that high resistance and low resistance are present in the same voltage.

In addition, a ferroelectric memory has high remnant polarization characteristics when being powered on using unique characteristics of a ferroelectric substance, such that it is used as a memory device.

In the meantime, in order to satisfy the LPDDR2 specification, after a code corresponding to each command is input to a system, a first block address and a second block address (i.e., the last block address) are sequentially input to the system.

As a result, the LPDDR non-volatile memory controls states of all blocks present between the first block address and the last block address such that it can enable all the blocks to perform a command operation corresponding to a lock state, an unlock state, or a lock-down state.

Specifically, a product not based on a Joint Electron Device Engineering Council (JEDEC) standard of the LPDDR2 non-volatile memory receives only one address related to a block address, and it is necessary for the product to perform a block lock operation, a block unlock operation, or a block lock-down operation only in a block corresponding to the received address.

A memory region of the semiconductor memory device is divided into a large number of memory blocks, and each memory block enters any one of a block lock state, a block unlock state, and a block lock-down state according to a control signal of a block control command.

In this case, a programming operation, a data deletion operation, and an overwrite operation of the memory block of either the block lock state or the block lock-down state are limited.

The programming operation, the data deletion operation, and the overwrite operation of the memory block are allowed in the block unlock state.

For example, if 1024 memory blocks are present, 1024 block control command generation circuits are needed to command each memory block to enter a block lock state, a block unlock state, or a block lock-down state.

That is, it is necessary for the semiconductor memory device to include as many block control command generation circuits as the number of memory blocks, such that each block control command generation circuit needs to be reduced in size.

Specifically, in order to satisfy the specification of the LPDDR2 non-volatile memory, it is necessary for the memory to automatically operate so that lock states of all blocks present between the first block address and the last block address becomes one of the command code states (e.g., lock, unlock, and lock-down states).

BRIEF SUMMARY OF THE INVENTION

Various embodiments of the present invention are directed to providing a block control device of a semiconductor memory and a method for controlling the same that substantially obviate one or more problems due to limitations and disadvantages of the related art.

First, an embodiment of the present invention relates to a technology that is capable of automatically controlling a lock state, an unlock state, or a lock-down state of all blocks present between a first block address and a last block address using a counter of an LPDDR2 non-volatile memory device.

Second, an embodiment of the present invention relates to a technology that is capable of sequentially generating block addresses from a first block address to a last block address using a block address count clock.

Third, an embodiment of the present invention relates to a technology that generates the same pulse without toggling a clock of a block address counter when the first block address is identical to the last block address, so that one block data activation pulse can be enabled.

Fourth, an embodiment of the present invention relates to a technology capable of enabling a block data activation pulse according to a block address counter block and unequal pulses when the first block address is different from the last block address.

Fifth, an embodiment of the present invention relates to a technology for controlling a block operation state using a counter, such that the size of the block control command generation circuit can be reduced.

In accordance with one embodiment of the present invention, a block control device for a semiconductor memory includes a block address comparator configured to compare a first block address with a last block address, and output a first pulse or second pulse according to the comparison result; a block address driver configured to output a lock state control signal for controlling a block address in response to the first pulse; a block address counter configured to count block addresses from the first block address to the last block address in response to the second pulse, and generate a block data activation pulse; and a block address register configured to store a lock state of a corresponding block in response to the lock state control signal and the block data activation pulse.

In accordance with another embodiment of the present invention, a block control method for use in a semiconductor memory the method comprising comparing a first block address with a last block address, and outputting a first pulse or a second pulse according to the comparison result; outputting a lock state control signal for driving a block address when the first pulse is activated counting a plurality of block addresses from the first block address to the last block address when the second pulse is activated so as to generate a block data activation pulse; and storing a lock state of a corresponding block in a block address register in response to the lock state control signal and the block data activation pulse.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 1:
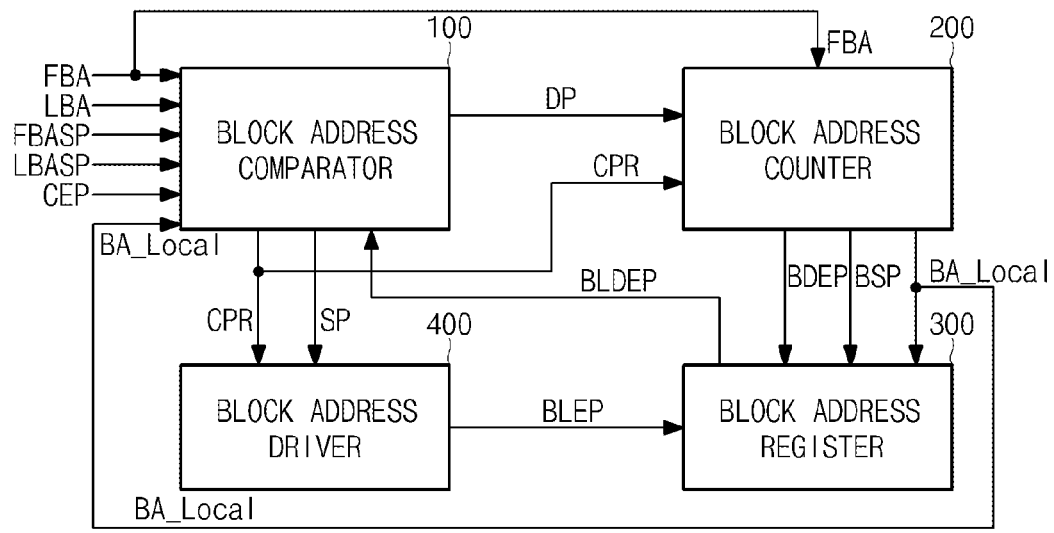
FIG. 1 is a block diagram illustrating a block control device of a semiconductor memory according to an embodiment of the present invention.

FIG. 1 is a block diagram illustrating a block control device of a semiconductor memory according to an embodiment of the present invention. In more detail, FIG. 1 is a block diagram illustrating a block control device for controlling a lock state, an unlock state, or a lock-down state of the semiconductor memory. This embodiment can be applied to a Low Power Double-Data-Rate 2 (LPDDR2) non-volatile memory as defined in a Joint Electron Device Engineering Council (JEDEC) standard specification.

In order to control a lock state of a memory block, the block control device includes a block address comparator 100, a block address counter 200, a block address register 300, and a block address driver 400.

The block address comparator 100 receives a first block address FBA, a last block address LBA, a first strobe pulse FBASP, a last strobe pulse LBASP, a comparison execution pulse CEP, a block address control signal BA_Local, and a lock operation last pulse BLDEP as input signals, outputs a comparison pulse CPR and a same pulse SP to the block address driver 400, and outputs the comparison pulse CPR and an unequal pulse (also known as a different pulse) DP to the block address counter 200.

In this case, the first block address FBA and the last block address LBA may correspond to bock addresses input to a processor so as to allow each block to be operated by a lock command, an unlock command, or a lock-down command. Each block address may correspond to a minimum unit capable of discriminating the block's lock state.

The block lock command operation is performed in the memory in the range from the first block address FBA to the last block address LBA. That is, the same block lock state is maintained in the range from the first block address FBA to the last block address LBA.

The first strobe pulse FBASP is a strobe signal of the first block address FBA. The last strobe pulse LBASP is a strobe signal of the last block address LBA.

The block address counter 200 receives the first block address FBA, the unequal pulse DP, and the comparison pulse CPR, such that it outputs a block data activation pulse BDEP, a clock last pulse BSP, and the block address control signal BA_Local.

In addition, the block address register 300 receives a lock state control signal BLEP, the block data activation pulse BDEP, the clock last pulse BSP, and the block address control signal BA_Local, such that it outputs the lock operation last pulse BLDEP to the block address comparator 100 and stores a locks state of the corresponding block.

That is, in the case where the same pulse SP is activated and the lock state control signal BLEP is activated, block data for only one block is stored in the block address register 300. Otherwise, if the unequal pulse DP is activated so that the block data activation pulse BDEP is activated, block data for a plurality of blocks is stored in the block address register 300.

In addition, the block address driver 400 outputs the lock state control signal BLEP for controlling a lock state in response to the comparison pulse CPR and the same pulse SP to the block address register 300.

Figure 2:
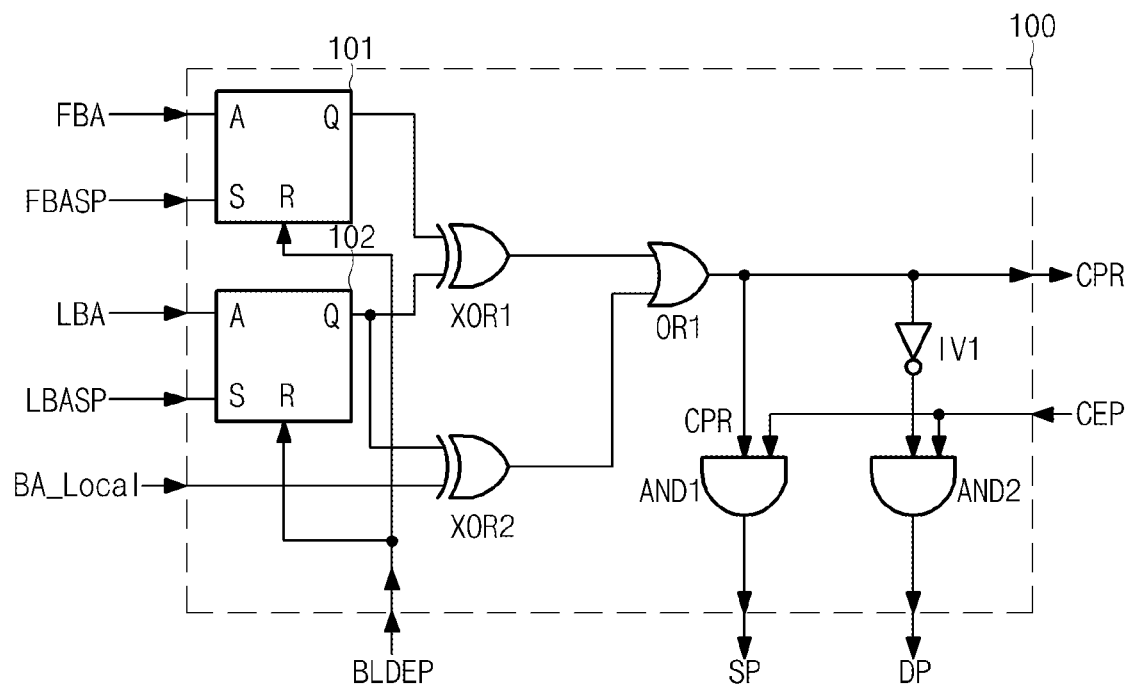
FIG. 2 is a detailed circuit diagram illustrating a block address comparator shown in FIG. 1.

FIG. 2 is a detailed circuit diagram illustrating the block address comparator 100 shown in FIG. 1.

Referring to FIG. 2, the block address comparator 100 includes address strobe units 101 and 102, exclusive-OR (XOR) gates XOR1 and XOR2, an OR gate OR1, AND gates AND1 and AND2, and an inverter IV1. In this case, the XOR gates XOR1 and XOR2, the OR gate OR1, the AND gates AND1 and AND2, and the inverter IV1 correspond to a logic operation unit. One of skill in the art will recognize that it is possible to combine various components to form other logic operation units within the scope of the invention.

The address strobe unit 101 performs a strobe action of the first block address FBA in response to the first strobe pulse FBASP, and outputs the strobe result. The address strobe unit 102 performs a strobe action of the last block address LBA in response to the last strobe pulse LBASP.

In addition, the address strobe units 101 and 102 enter a reset state upon receiving the lock operation last pulse BLDEP.

The XOR gate XOR1 performs an XOR operation of output signals of the address strobe units 101 and 102, and outputs the XOR operation result. For example, if the first block address FBA is identical to the last block address LBA, the XOR gate XOR1 outputs a logic signal of 0. Otherwise, if the first block address FBA is different from the last block address LBA, the XOR gate XOR1 outputs a logic signal of 1.

The XOR gate XOR2 performs an XOR operation between the output signal of the address strobe unit 102 and the block address control signal BA_Local, and outputs the XOR operation result. For example, if the output signal of the address strobe unit 102 is identical to the block address control signal BA_Local, the XOR gate XOR2 outputs the logic signal of 0. If the output signal of the address strobe unit 102 is different from the block address control signal BA_Local, the XOR gate XOR2 outputs the logic signal of 1.

The OR gate OR1 performs an OR operation of the output signals of the XOR gates XOR1 and XOR2, such that it outputs the comparison pulse CPR according to the OR operation result. The AND gate AND1 performs an AND operation between the comparison pulse CPR and the comparison execution pulse CEP, such that it outputs the same pulse SP. The AND gate AND2 performs an AND operation between the comparison execution pulse CEP and the inverted comparison pulse CPR output from the inverter IV1, such that it outputs the unequal pulse DP.

Figure 3:
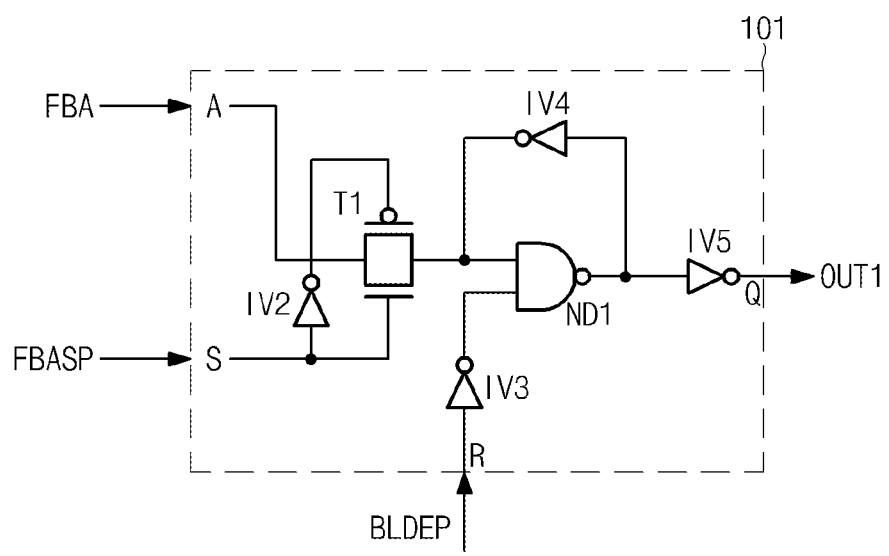
FIGS. 3 and 4 are circuit diagrams illustrating address strobe units shown in FIG. 2, respectively.

FIG. 3 is a detailed circuit diagram illustrating the address strobe unit 101 shown in FIG. 2.

Referring to FIG. 3, the address strobe unit 101 includes a transfer gate T1, a NAND gate ND1, and inverters IV2~IV5.

If the first strobe pulse FBASP is activated, the transfer gate T1 selectively transfers the first block address FBA.

The NAND gate ND1 performs a NAND operation between an output signal of the transfer gate T1 and the inverted lock operation last pulse BLDEP generated from the inverter IV3, and outputs the NAND operation result. The inverter IV4 inverts an output signal of the NAND gate ND1, and outputs the inverted signal to an input terminal of the NAND gate ND1. The inverter IV5 inverts the output signal of the NAND gate ND1, and outputs the inverted signal. In this case, the NAND gate ND1 and the inverter IV4 belong to a latch unit.

In the above-mentioned address strobe unit 101, if the first strobe pulse FBASP is activated to a high level, the transfer gate T1 is turned on so that the first block address FBA is output to the NAND gate ND1.

The latch unit composed of the NAND gate ND1 and the inverter IV4 latches the first block address FBA received from the transfer gate T1 for a predetermined period of time, and outputs the latched result.

Figure 4:
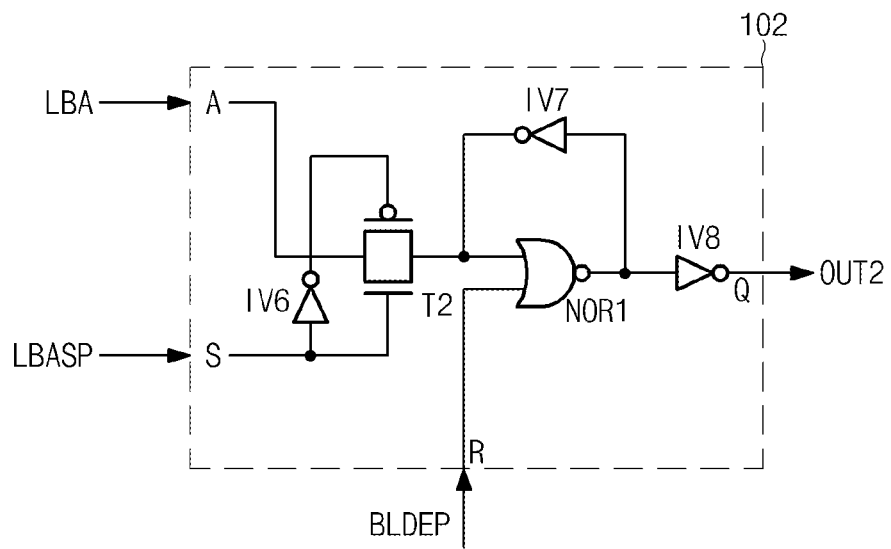

FIG. 4 is a detailed circuit diagram illustrating the address strobe unit 102 shown in FIG. 2.

Referring to FIG. 4, the address strobe unit 102 includes a transfer gate T2, a NOR gate NOR1, and inverters IV6~IV8.

If the last strobe pulse LBASP is activated, the transfer gate T2 selectively transfers the last block address LBA.

The NOR gate NOR1 performs a NOR operation between an output signal of the transfer gate T2 and the lock operation last pulse BLDEP, and outputs the NAND operation result.

The inverter IV7 inverts an output signal of the NOR gate NOR1, and outputs the inverted signal to an input terminal of the NOR gate NOR1. The inverter IV8 inverts the output signal of the NOR gate NOR1, and outputs the inverted result. In this case, the NOR gate NOR1 and the inverter IV7 belong to a latch unit.

In the above-mentioned address strobe unit 102, if the last strobe pulse LBASP is activated to a high level, the transfer gate T2 is turned on so that the last block address LBA is output to the NOR gate NOR1.

The latch unit composed of the NOR gate NOR1 and the inverter IV7 latches the last block address LBA received from the transfer gate T2 for a predetermined period of time, and outputs the latched result.

Figure 5:
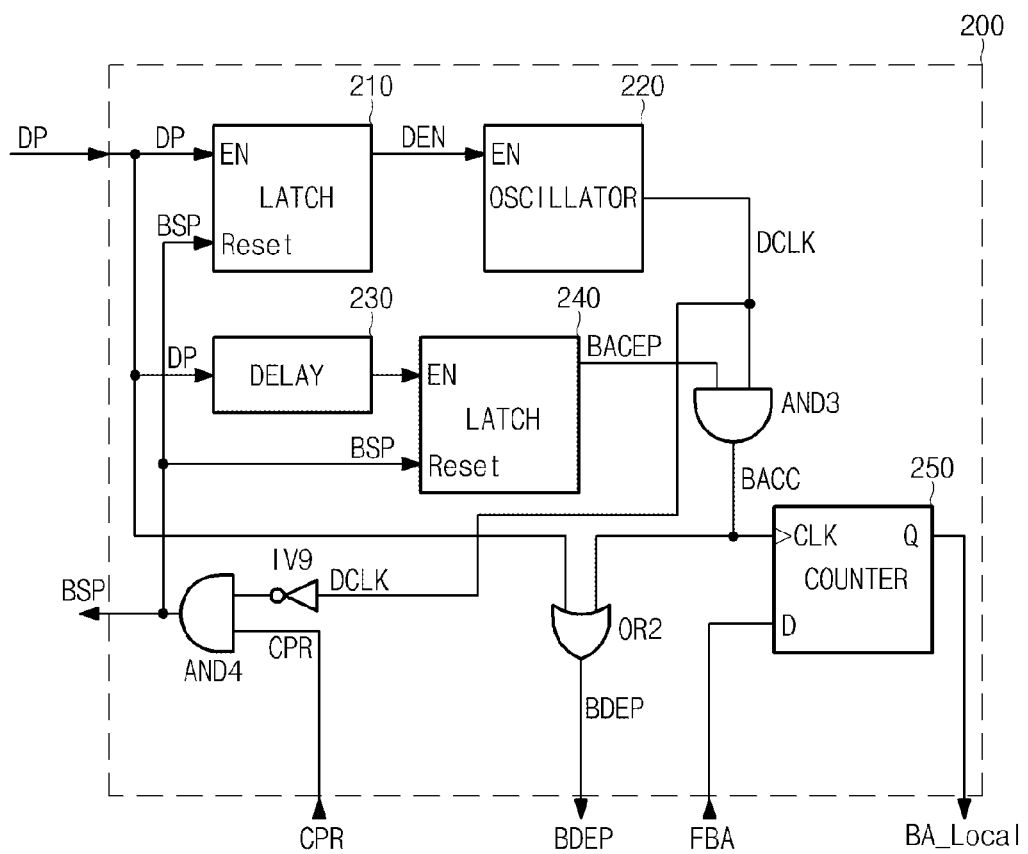
FIG. 5 is a detailed circuit diagram illustrating a block address counter shown in FIG. 1.

FIG. 5 is a detailed circuit diagram illustrating the block address counter 200 shown in FIG. 1.

Referring to FIG. 5, the block address counter 200 includes a first latch unit 210, an oscillator 220, a delay unit 230, a second latch unit 240, a counter 250, AND gates AND3 and AND4, an OR gate OR2, and an inverter IV9. In this case, the AND gates AND3 and AND4, the OR gate OR2, and the inverter IV4 correspond to a logic operation unit.

The latch unit 210 latches the unequal pulse DP, and outputs an unequal activation pulse DEN. In this case, the latch unit 210 may be reset by the clock last pulse BSP.

The oscillator 220 performs an oscillation operation in response to the unequal activation pulse DEN, such that it outputs an unequal clock signal DCLK.

In addition, the delay unit 230 delays the unequal pulse DP for a predetermined period of time, and outputs the delayed result to the latch unit 240. The latch unit 240 latches an output signal of the delay unit 230, and outputs a clock enable pulse BACEP. In this case, the latch unit 240 may be reset by the clock last pulse BSP.

The AND gate AND3 performs an AND operation between the unequal clock signal DCLK and the clock enable pulse BACEP, such that it outputs an block address counter clock signal BACC.

In this case, the block address counter clock signal BACC indicates a clock pulse acquired when block addresses from the first block address FBA to the last block address LBA are counted according to the result of comparison between the first block address FBA and the last block address LBA.

The AND gate AND4 performs an AND operation between the comparison pulse CPR and an inverted signal of the unequal clock DCLK output from the inverter IV9, such that it outputs the clock last pulse BSP.

The OR gate OR2 performs an OR operation between the unequal pulse DP and the block address counter clock signal BACC, such that it outputs the block data activation pulse BDEP.

The counter 250 counts the first block address FBA in response to the block address counter clock signal BACC, such that it outputs the block address control signal BA_Local.

Figure 6:
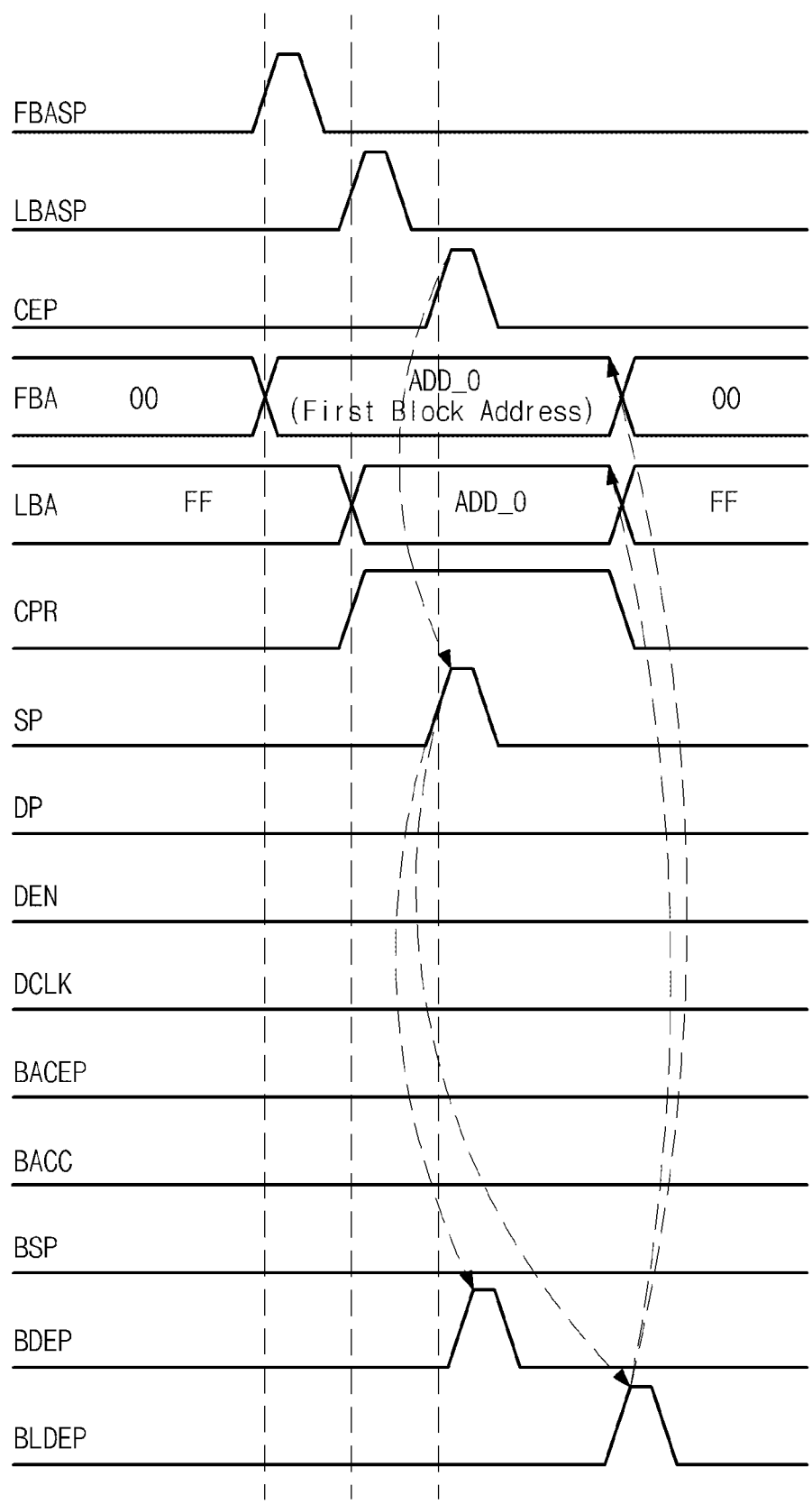
FIGS. 6 and 7 are timing diagrams illustrating a block control device of a semiconductor memory according to an embodiment of the present invention.
Figure 7:
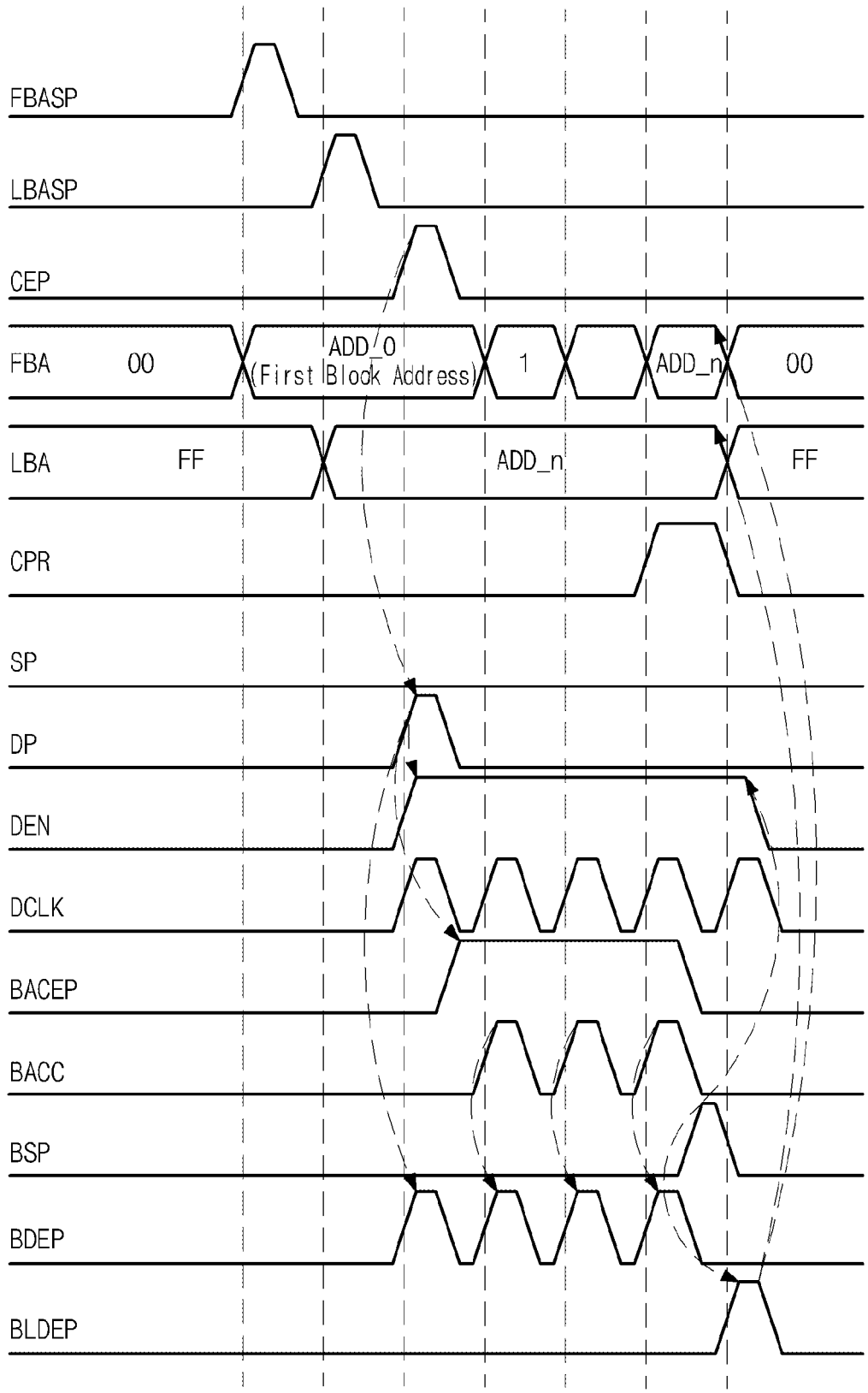

FIGS. 6 and 7 are timing diagrams illustrating a block control device of a semiconductor memory according to an embodiment of the present invention. Operations of the above-mentioned embodiments of the present invention will hereinafter be described with reference to FIGS. 6 and 7. The present embodiment sequentially controls the lock operation, the unlock operation, and the lock-down operation according to individual block addresses in consideration of the following two conditions.

In case of the first condition, the present embodiment compares the first block address FBA with the last block address LBA. If the two addresses FBA and LBA are equal to each other, the control operation shown in FIG. 6 is carried out.

After the first strobe pulse FBASP is activated, the block address comparator 100 compares the first block address FBA with the last block address LBA. If the first block address FBA is identical to the last block address LBA, the same pulse SP is activated in response to the comparison execution pulse CEP.

In other words, if the first block address FBA is identical to the last block address LBA, the block address counter clock signal BACC is not generated. Instead of generating no block address counter clock signal BACC, the lock state control signal BLEP is activated by the first block address FBA.

In this case, the lock state control signal BLEP is activated by the same pulse SP, such that an operation of the lock, unlock or lock-down command is carried out only in one block corresponding to the activated lock state control signal BLEP.

The comparison pulse CPR is enabled to a high level when the first block address FBA is identical to the last block address LBA.

When the first block address FBA and the last block address LBA are initially input in the same manner, i.e., when only one block is controlled by the lock, unlock or lock-down state, the same pulse SP is generated. In this case, the AND operation between the comparison execution pulse CEP and the comparison pulse CPR is performed. Thus, if the comparison execution pulse CEP and the comparison pulse CPR are in a high level, the same pulse SP is activated to a high level.

The comparison pulse CPR is activated to a high level when the block address control signal BA_Local is identical to the last block address LBA.

If the first block address FBA is identical to the last block address LBA, the lock operation last pulse BLDEP is generated by the same pulse SP. If the lock operation last pulse BLDEP is activated, both the first block address FBA and the last block address LBA are initialized to prepare for the next operation.

In case of the second condition, the first block address FBA is compared with the last block address LBA. If the two addresses FBA and LBA are different from each other, the control operation of FIG. 7 is performed.

The block address comparator 100 compares the first block address FBA with the last block address LBA after the first strobe pulse FBASP is activated. If the two addresses FBA and LBA are different from each other, the block address comparator 100 activates the unequal pulse DP in response to the comparison execution pulse CEP.

The latch 210 latches the unequal pulse DP and outputs the unequal activation pulse DEN. In this case, the clock enable pulse BACEP is disabled by the clock last pulse BSP. The clock last pulse BSP is generated until the first block address FBA is counted and then the counted block address reaches the last block address LBA.

The latch unit 240 latches the unequal pulse DP and thus outputs the clock enable pulse BACEP. In this case, the clock enable pulse BACEP is enabled by the unequal pulse DP, and is disabled by the clock last pulse BSP. If the clock last pulse BSP is activated, the unequal activation pulse DEN becomes disabled.

While the unequal activation pulse DEN is activated to a high level, the unequal clock signal DCLK is generated by the oscillator 220.

In other words, if the last block address LBA is higher than the first block address FBA, the block address counter clock signal BACC is generated by a difference between the first block address FBA and the last block address LBA.

The block address counter clock signal BACC is a clock signal that is generated during a predetermined period in which the clock enable pulse BACEP is enabled.

Therefore, the counter 250 counts block addresses starting from the first block address FBA according to the block address counter clock signal BACC, and counts up the block address control signal BA_Local until the block address reaches the last block address LBA.

For example, the counter 250 counts the first block address, such that it outputs a plurality of block addresses from the first block address to the last block address, i.e., a first block address, 'first block address+1', 'first block address+2', 'first block address+3', . . . , and 'first block address+N'.

In this case, the OR gate OR2 performs an OR operation between the unequal pulse DP and the block address counter clock signal BACC, such that it outputs the block data activation pulse BDEP. In response to the block data activation pulse BDEP, operations of the lock, unlock, and lock-down commands of each block are carried out.

The comparison pulse CPR is enabled to a high level when the first block address FBA is identical to the last block address LBA.

The unequal pulse DP is generated when the last block address LBA is higher than the first block address FBA. In this case, the comparison execution pulse CEP and the comparison pulse CPR are combined with each other. If the comparison execution pulse CEP is different from the comparison pulse CPR, the unequal pulse DP is activated to a high level.

In this case, the comparison pulse CPR is activated to a high level when the block address control signal BA_Local is identical to the last block address LBA.

If the first block address FBA is different from the last block address LBA, the lock operation last pulse BLDEP is generated by the clock last pulse BSP input to the block address register 300. If the lock operation last pulse BLDEP is activated, both the first block address FBA and the last block address LBA are initialized to prepare for the next operation.

Meanwhile, in the case where the first block address FBA is higher than the last block address LBA, this means a spec-over state indicating that a current state does not satisfy the specification so that the lock operation is not performed.

The above-mentioned embodiments of the present invention can satisfy lock, unlock, and lock-down operations of each block based on the LPDDR2 non-volatile memory specification.

In addition, the present embodiment enables the memory to operate so that lock states of all blocks located between the first block address and the last block address are in any one of block lock command code states (lock, unlock and lock-down states). Such an operation is processed in the memory device.

As apparent from the above description, the block control device of the semiconductor memory and the method for controlling the same according to the embodiments of the present invention have the following effects.

First, embodiments of the present invention relate to a technology that is capable of automatically controlling a lock state, an unlock state, or a lock-down state of all blocks present between a first block address and a last block address using a counter of an LPDDR2 non-volatile memory device.

Second, embodiments of the present invention relate to a technology for controlling a block operation state using a counter, such that the size of the block control command generation circuit can be reduced.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A device for controlling a lock state of a block in a semiconductor memory, the device comprising:
    a block address comparator configured to compare a first block address with a last block address, wherein if the first block address is identical to the last block address, a first pulse is activated, and if the first block address is different from the last block address, a second pulse is activated;
    a block address driver configured to output a lock state control signal for controlling a block address in response to the first pulse;
    a block address counter configured to count block addresses from the first block address to the last block address in response to the second pulse, and generate a block data activation pulse; and
    a block address register configured to store a lock state of a corresponding block in response to the lock state control signal and the block data activation pulse.

2. The device according to claim 1, wherein the block address counter is configured to count the block addresses from the first block address, and sequentially generate the block data activation pulse until the last block address is counted.

3. The device according to claim 1, wherein the first pulse is activated so that the lock state of the corresponding block is controlled.

4. The device according to claim 1, wherein the second pulse is activated so that the block data activation pulse is sequentially generated.

5. The device according to claim 4, wherein the last block address is higher than the first block address.

6. The device according to claim 1, wherein the block address comparator is configured to activate a comparison pulse when the first block address is identical to the last block address.

7. The device according to claim 6, wherein the block address comparator includes:
    a first logic operation unit configured to generate the first pulse when the comparison pulse and a comparison execution pulse are activated.

8. The device according to claim 6, wherein the block address comparator includes:
    a second logic operation unit configured to perform a logic operation between an inverted signal of the comparison pulse and a comparison execution pulse, and generate the second pulse.

9. The device according to claim 6, wherein the block address comparator includes:
    a third logic operation unit configured to perform a logic operation between the first block address and the last block address, and generate the comparison pulse.

10. The device according to claim 6, wherein the block address comparator includes:
    a fourth logic operation unit configured to perform a logic operation between a block address control signal fed back from the block address counter and the last block address, and generate the comparison pulse.

11. The device according to claim 1, wherein the block address comparator includes:
    a first address strobe unit configured to perform a strobe action of the first block address when a first strobe pulse is activated; and
    a second address strobe unit configured to perform a strobe action of the last block address when a last strobe pulse is activated.

12. The device according to claim 1, wherein the block address comparator initializes a value of the first block address and a value of the last block address upon receiving a lock operation last pulse from the block address register.

13. The device according to claim 1, wherein the block address counter includes:
    a first latch configured to generate an unequal activation pulse and latch the unequal pulse;
    an oscillator configured to generate an unequal clock signal by performing an oscillation operation in response to the unequal activation pulse;
    a delay unit configured to delay the second pulse for a predetermined time;
    a second latch configured to latch an output of the delay unit, and generate a clock enable pulse;
    a fifth logic operation unit configured to perform a logic operation between the clock enable pulse and the unequal clock signal, and output a block address counter clock signal;
    a sixth logic operation unit configured to perform a logic operation between the second pulse and the block address counter clock signal, and output the block data activation pulse; and
    a counter configured to count the first block address in response to the block address counter clock signal, and output a block address control signal.

14. The device according to claim 13, wherein the block address counter further includes:
    a seventh logic operation unit configured to perform a logic operation between an inverted signal of the unequal clock signal and a comparison pulse received from the block address comparator, and output a clock last pulse.

15. The device according to claim 14, wherein the first latch is reset by the clock last pulse.

16. The device according to claim 14, wherein the second latch is reset by the clock last pulse.

17. The device according to claim 14, wherein the seventh logic operation unit outputs the inverted signal of the unequal clock signal as the clock last pulse during an activation period of the comparison pulse.

18. The device according to claim 13, wherein the fifth logic operation unit outputs the unequal clock signal as the block address counter clock signal during an activation period of the clock enable pulse.

19. The device according to claim 13, wherein the sixth logic operation unit, if at least one of the second pulse and the block address counter clock signal is activated, outputs the block data activation pulse.

20. The device according to claim 1, wherein the block address register stores a signal for controlling a block lock state, a block unlock state, and a block lock-down state of a Low Power Double-Data-Rate 2 (LPDDR2) non-volatile memory.

21. A method for controlling a lock state of a block in a semiconductor memory, the method comprising:
  comparing a first block address with a last block address, wherein if the first block address is identical to the last block address, a first pulse is activated, and if the first block address is different from the last block address, a second pulse is activated;
  outputting a lock state control signal for driving a block address when the first pulse is activated;
  counting a plurality of block addresses from the first block address to the last block address when the second pulse is activated so as to generate a block data activation pulse; and
  storing a lock state of a corresponding block in a block address register in response to the lock state control signal and the block data activation pulse.

22. The method according to claim 21, further comprising:
  counting the block addresses from the first block address, and sequentially generating the block data activation pulse until the last block address is counted when the second pulse is activated.

23. The method according to claim 21,
  wherein the first pulse is activated so that a lock state of one block is controlled.

24. The method according to claim 21, wherein the second pulse is activated so that the block data activation pulse is sequentially generated.

25. The method according to claim 24, wherein the last block address is higher than the first block address.

26. The method according to claim 21, wherein outputting the first pulse includes:
  activating a comparison pulse when the first block address is identical to the last block address; and
  generating the first pulse under a condition that the comparison pulse and a comparison execution pulse are activated.

27. The method according to claim 21, wherein outputting the first pulse or the second pulse includes:
  initializing a value of the first block address and a value of the last block address upon receiving a lock operation last pulse from the block address register.

28. The method according to claim 21, wherein generating the block data activation pulse includes:
  generating an unequal activation pulse by latching the second pulse;
  generating an unequal clock signal by performing an oscillation operation in response to the unequal activation pulse;
  delaying the second pulse for a predetermined time, latching the delayed second pulse, and generating a clock enable pulse;
  outputting a block address counter clock signal in response to the clock enable pulse and the unequal clock signal;
  performing a logic operation between the second pulse and the block address counter clock signal, and outputting the block data activation pulse; and
  counting the first block address in response to the block address counter clock signal, and outputting a block address control signal,
  wherein the second pulse is an unequal pulse.

29. The method according to claim 21, wherein the block address register stores a signal for controlling a block lock state, a block unlock state, and a block lock-down state of a Low Power Double-Data-Rate 2 (LPDDR2) non-volatile memory.

* * * * *